(12) United States Patent
Sander et al.

(10) Patent No.: US 7,843,006 B2
(45) Date of Patent: Nov. 30, 2010

(54) SEMICONDUCTOR COMPONENT ARRANGEMENT HAVING A POWER TRANSISTOR AND A TEMPERATURE MEASURING ARRANGEMENT

(75) Inventors: Rainald Sander, Munich (DE); Markus Zundel, Egmating (DE)

(73) Assignee: Infineon Technologies AG, Munich (DE)

( * ) Notice: Subject to any disclaimer, the term of this patent is extended or adjusted under 35 U.S.C. 154(b) by 465 days.

(21) Appl. No.: 11/701,248

(22) Filed: Feb. 1, 2007

(65) Prior Publication Data

US 2007/0205464 A1 Sep. 6, 2007

(30) Foreign Application Priority Data

Feb. 3, 2006 (DE) ........................ 10 2006 005 033

(51) Int. Cl.
*H01L 27/12* (2006.01)
(52) U.S. Cl. ................... 257/350; 257/334; 257/332; 257/330; 257/338; 257/339; 257/331; 257/E21.371; 257/E21.387; 257/E21.403; 257/E21.441; 257/E21.448; 257/E21.452
(58) Field of Classification Search ................ 257/341, 257/350, 332, 334, 330, 338, 339, 331, E21.371, 257/E21.387, E21.403, E21.441, E21.448, 257/E21.452
See application file for complete search history.

(56) References Cited

U.S. PATENT DOCUMENTS

| 5,336,943 | A | * | 8/1994 | Kelly et al. | .................. 327/513 |
| 5,563,760 | A | * | 10/1996 | Lowis et al. | ................. 361/103 |
| 5,691,555 | A | * | 11/1997 | Zambrano et al. | ........... 257/332 |
| 6,948,847 | B2 | | 9/2005 | Pihet et al. | |
| 2005/0275013 | A1 | | 12/2005 | Sander et al. | |

FOREIGN PATENT DOCUMENTS

| DE | 38 31 012 A1 | 3/1990 |
| DE | 203 15 053 U1 | 1/2004 |
| DE | 102004026233 A1 | 12/2005 |

OTHER PUBLICATIONS

Baliga, B. Jayant. *Power Semiconductor Devices*. Boston, PWS Publishing Company: 1996. p. 412-414. (5 Pages).

* cited by examiner

*Primary Examiner*—Wael M Fahmy
*Assistant Examiner*—Marc Armand
(74) *Attorney, Agent, or Firm*—Maginot, Moore & Beck LLP (57) ABSTRACT

A semiconductor component arrangement includes a power transistor and a temperature measurement circuit. The power transistor includes a gate electrode, a source zone, a drain zone and a body zone. The body zone is arranged in a first semiconductor zone of a first conduction type. The temperature measuring circuit comprises a temperature-dependent resistor and an evaluation circuit coupled to the temperature-dependent resistor. The resistor is formed by a portion of said first semiconductor zone.

15 Claims, 6 Drawing Sheets

FIG 1A

FIG 2
n-channel type

FIG 3
p-channel type

SEMICONDUCTOR COMPONENT ARRANGEMENT HAVING A POWER TRANSISTOR AND A TEMPERATURE MEASURING ARRANGEMENT

TECHNICAL FIELD

The invention relates to a semiconductor component arrangement having a power transistor, particularly a trench transistor, and a temperature measuring arrangement.

BACKGROUND

Trench transistors are power transistors which have a gate electrode arranged in a trench in a semiconductor body and in which a direction of current flow runs in a vertical direction of a semiconductor body in which the transistor is integrated. Examples of such trench transistors are described in B. J. Baliga: Chapter 7.10.2 UMOS Structure, in: Power Semiconductor Devices, PWS Publishing Company, Boston, 1995, pp. 412ff.

Such power transistors are used to switch voltages in the range from a few tens of volts to a few hundred volts and correspondingly large currents. The power loss which is inevitably converted into heat in the transistor during such switching operations causes the semiconductor body or semiconductor substrate in which the transistor is integrated to heat up. In the extreme case, overheating may occur which damages the component itself and possibly also other components arranged in an assembly with the overheated component.

To protect a power transistor against inadmissibly high temperatures and hence against destruction by heat, it is known practice to record the temperature in the transistor's semi-conductor body and to take suitable action when a critical temperature is reached or exceeded, for example to switch off the component.

The temperature in a semiconductor body may be measured using both reverse biased and forward biased diodes. In this case, use is made of the fact that both the reverse current in a reverse biased diode and the voltage drop across a forward biased diode carrying a constant current have a pronounced temperature dependency, which means that these variables can be used to measure temperature.

However, there is still a need for a semiconductor component arrangement having a power transistor and a temperature measuring means comprising a temperature measuring resistor in which the temperature measuring resistor is simple to produce by means of technologies used for producing power transistors and has a high level of temperature sensitivity.

SUMMARY

One embodiment of the inventive semiconductor component arrangement comprises a power transistor having a gate electrode, a source zone, a drain zone and a body zone, the body zone being arranged in a first semiconductor zone of a first conduction type. In addition, the component arrangement comprises a temperature measuring arrangement having a temperature measuring resistor and having an evaluation circuit coupled to the measuring resistor. In this context, a temperature measuring resistor is produced by a portion of the first semiconductor zone, which also contains the body zone.

Such a temperature measuring resistor can be produced using conventional methods for producing a doped semiconductor zone in a semiconductor body. The use of the same semiconductor zone to produce the measuring resistor as to produce the body zone affords the advantage that, at customary dopant doses, such as are used for body zones in power components, it is possible to achieve a temperature measuring resistor which has a higher temperature coefficient than polycrystalline semiconductor material, for example. Customary dopant doses for producing the body zone of a power MOSFET are in the region of $5 \cdot 10^{13}$ cm$^{-2}$, and changes in the resistance value are then roughly in the region of 50% per 100 K.

Temperature can be measured using the evaluation circuit by impressing a constant current from a current source on the temperature measuring resistor, which means that the measuring resistor has a voltage across it which is dependent on its resistance value and hence on the temperature. This voltage can now either be measured directly or can be compared with a reference voltage corresponding to a critical temperature value. If the voltage across the measuring resistor is higher than the reference voltage then an overtemperature is present, which can be indicated by means of an appropriate logic level on a signal line. Depending on this logic level, countermeasures can be taken, for example the power transistor can be switched off.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 1 shows a cross section (FIG. 1A) and a plan view (FIG. 1B) of a semiconductor body having a power transistor, which is in the form of a trench transistor and is integrated in the semiconductor body, and having a current measuring resistor.

DETAILED DESCRIPTION

FIG. 1 shows a first exemplary embodiment of the inventive component arrangement with the aid of cross sections through a semiconductor body 100 in which active component regions of a trench MOSFET and a temperature measuring resistor are integrated.

Figure 1A:
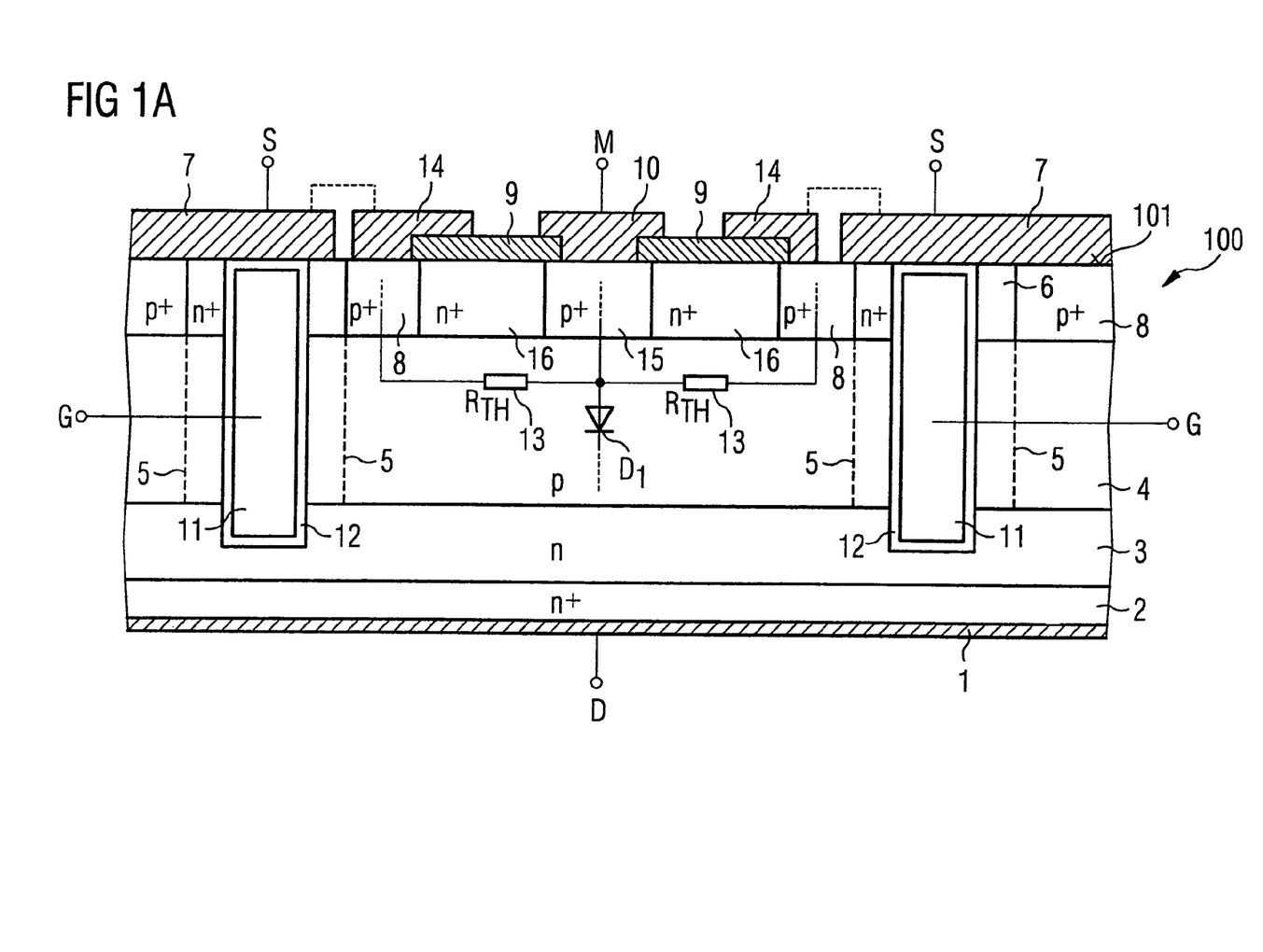

With reference to FIG. 1A, which shows the semiconductor body in a vertical sectional plane, the trench MOSFET has a drain zone 2, a drift zone 3, a body zone 5, whose doping is complementary to that of the drift zone 3, and a source zone 6, whose doping is complementary to that of the body zone 5, which are arranged above one another in a vertical direction of the semiconductor body 100. A gate electrode 11 is arranged in a trench which extends from a front 101 of the semiconductor body through the source zone 6 and the body zone 5 into the drift zone 3. The gate electrode 11 is insulated from the doped component zones by means of a gate dielectric 12, for example an oxide, and is used, as is known, to control an inversion channel in the body zone 5 between the source zone 6 and the drift zone 3.

On a back 102 of the semiconductor body 100, the drain zone 2 is in contact with by a drain electrode 1 which forms a drain terminal D for the MOSFET. In the region of the front 101, the source zone 6 is in contact with a source electrode 7 which forms a source terminal S for the MOSFET. This source electrode 7, which is made of a metal, for example, also shorts the source zone 6 and the body zone 5, arranged under the source zone 6 from the front 101. For this, the source electrode 7 makes contact with a body connecting zone 8 which is of the same conduction type as the body zone 5 and which extends from the front 101—in the example close to the source zone 6—to the body zone 5. In this case, the body connecting zone 8 has a higher level of doping than the body zone 5.

Figure 1B:
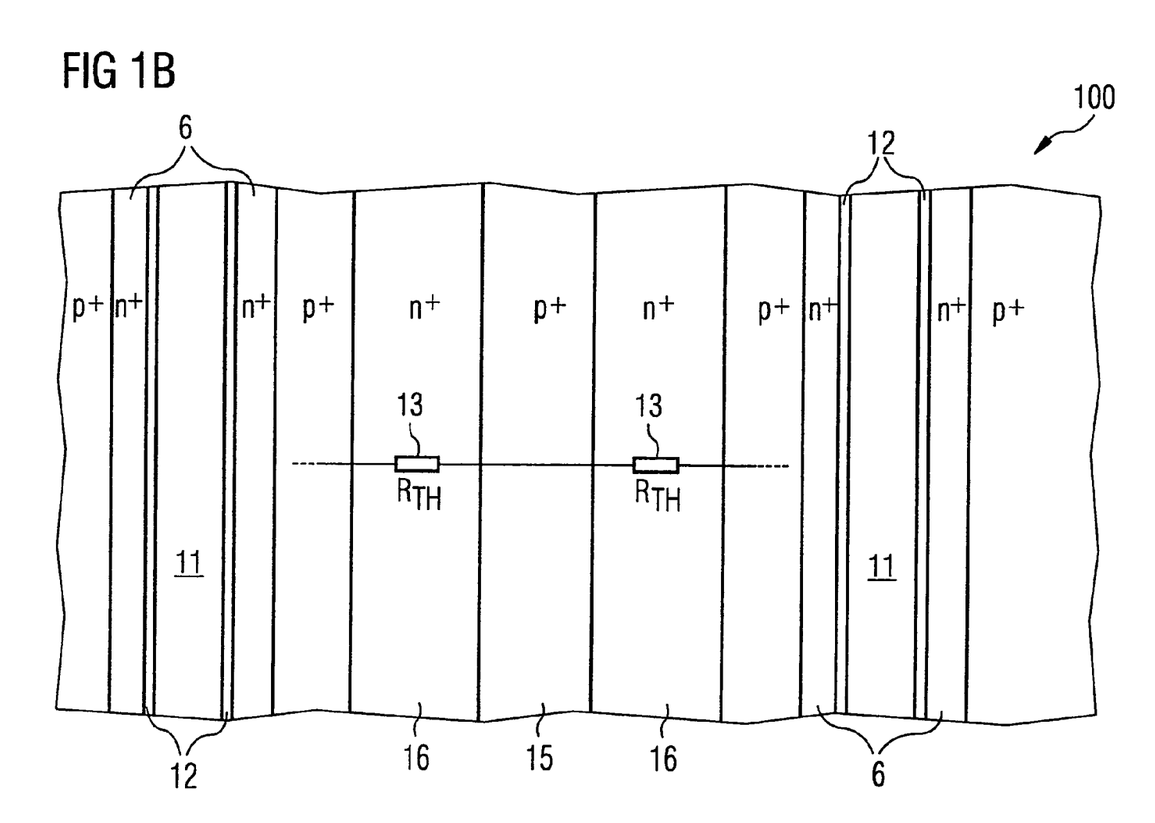

The gate electrode 11 runs in a direction perpendicular to the drawing plane shown in FIG. 1A as an elongate strip-like electrode, as shown in FIG. 1B, which shows a plan view of the front 101 of the semiconductor body 100. This longitudinal direction of the gate electrode 11 is referred to as the first lateral direction below. At one or more positions, the gate electrode 11 may be in contact (not shown in more detail) with a connecting contact which forms the gate terminal G (shown only schematically in FIG. 1A).

The drain zone of the MOSFET shown may be formed by a highly doped semiconductor substrate to which an epitaxial layer has been applied which contains the drift zone 3, the body zone 5 and the source zone 6.

In the case of the component shown, the body zone 5 is formed by a semiconductor zone 4 arranged in a vertical direction above the drift zone 3. This semiconductor zone 4 also forms a temperature-dependent resistor 13 of a temperature measuring means. The semiconductor zone 4 is in contact, at two contact points, with two first and second connecting electrodes 10, 14 which are electrically insulated from one another and which are arranged at a distance from one another. To reduce the contact resistance, highly doped first and second connecting zones 15, 8 of the same conduction type as the semiconductor zone 4 are provided for connecting electrodes 10, 14 with the semiconductor zone 4, wherein the second connecting zone corresponds to the connecting zone 8 for shorting the source zone 6 and the body zone 5. However, it is also possible for separate connecting zones for shorting the source 6 and the body 5 and for making contact with the temperature-dependent measuring resistor to be provided (not shown in more detail).

In the example, the two connecting zones have a semiconductor zone, whose doping is complementary to that of these connecting zones, connected between them which insulates the two connecting zones 8, 15 from one another by means of pn-junctions. The reference symbol 9 denotes an insulating layer arranged above this semiconductor zone 16.

In the example, the connecting contacts 10, 14 and the connecting zones are arranged at a distance from one another in a second lateral direction, running at right angles to the first lateral direction. The temperature measuring resistor 13 is formed by the region of the semiconductor zone 4 which has a measuring current flowing through it when a voltage is applied between the connecting electrodes 10, 14. This region corresponds approximately to the region which extends between these two connecting zones 8, 15 in an area located under the connecting zones 8, 15.

The second connecting electrode 14 may be in the form of a separate connecting electrode or may be in the form of a portion of the source electrode 7, which is shown in dashes in FIG. 1A. The first connecting electrode 10 forms a measuring terminal M for the component arrangement.

The MOSFET shown may be of cell-like design, i.e. it may have a plurality of transistor cells of the same type of design with a gate electrode 11 arranged in a trench, a source zone 6, a body zone 5, a drift zone 3 and a drain zone 2, respectively, as shown in FIG. 1A. The drain zone 2 and the drift zone 3 may be common to all transistor cells in this case.

Accordingly, a plurality of temperature measuring resistors may be present in the semiconductor body 100, these measuring resistors 13 each being able to be connected separately in order to be able to record the temperature within the cell array separately at a plurality of positions, or the individual measuring resistors being able to be connected in parallel by connecting their first terminals and their second terminals together, respectively.

The MOSFET shown in FIG. 1 is in the form of an n-channel MOSFET and has n-doped drain, drift and source zones 2, 3, 6 and a p-doped body zone 5. Naturally the concept described above can also be applied to p-channel MOSFETs or IGBTs. In the case of a p-MOSFET, the doped zones which are provided in the arrangement shown in FIG. 1 each need to have complementary doping to that of the zones shown in FIG. 1. An IGBT differs from a MOSFET in that its drain zone, which is also referred to as the emitter zone in an IGBT, has complementary doping to that of the drift zone.

Figure 2:
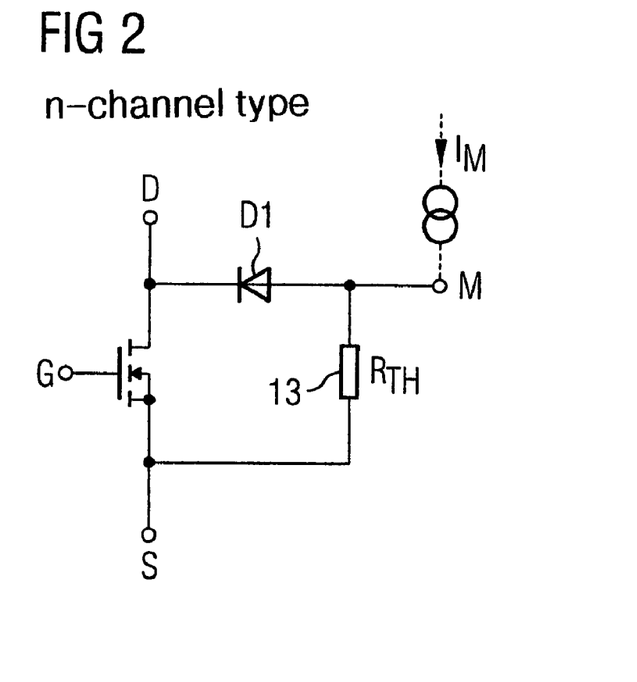
FIG. 2 shows the electrical equivalent circuit diagram for the semiconductor component arrangement when the power transistor is in the form of an n-channel MOSFET.

FIG. 2 shows the electrical equivalent circuit diagram for the arrangement shown in FIG. 1, assuming that the source electrode (6 in FIG. 1A) forms one of the terminals of the measuring resistor 13. In this case, the reference symbol T denotes the circuit symbol for the trench MOSFET. The temperature measuring resistor 13 is connected between the measuring terminal M and the source terminal S of the MOSFET. The reference symbol $D_1$ denotes a diode which is connected between the measuring terminal M and the drain terminal D of the MOSFET and which is formed by the pn-junction between the section of the semiconductor zone 4 with which the first connecting electrode (10 in FIG. 1A) is in contact and the drift zone (3 in FIG. 1A).

Figure 3:
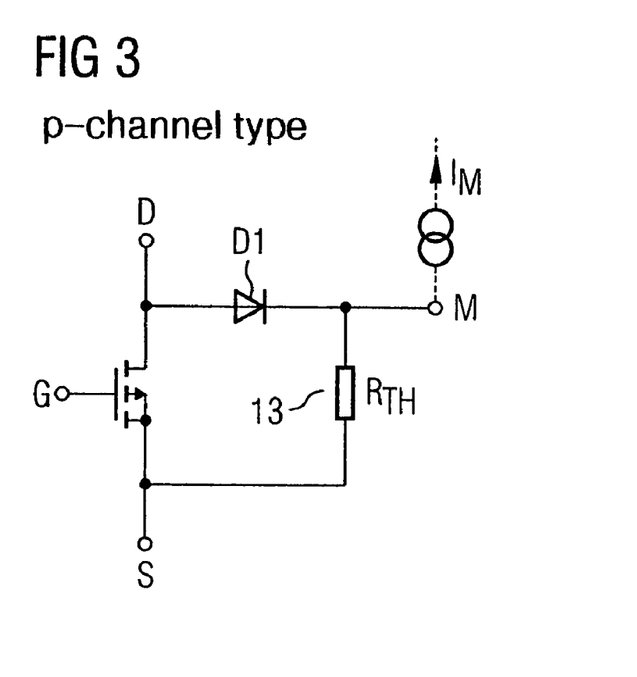
FIG. 3 shows the electrical equivalent circuit diagram for the semiconductor component arrangement when the power transistor is in the form of a p-channel MOS-FET.

FIG. 3 shows the electrical equivalent circuit diagram for the corresponding arrangement which has a p-channel MOSFET. In this case, the polarity of the diode $D_1$ is reversed in comparison with the circuit diagram in FIG. 2.

Figure 4:
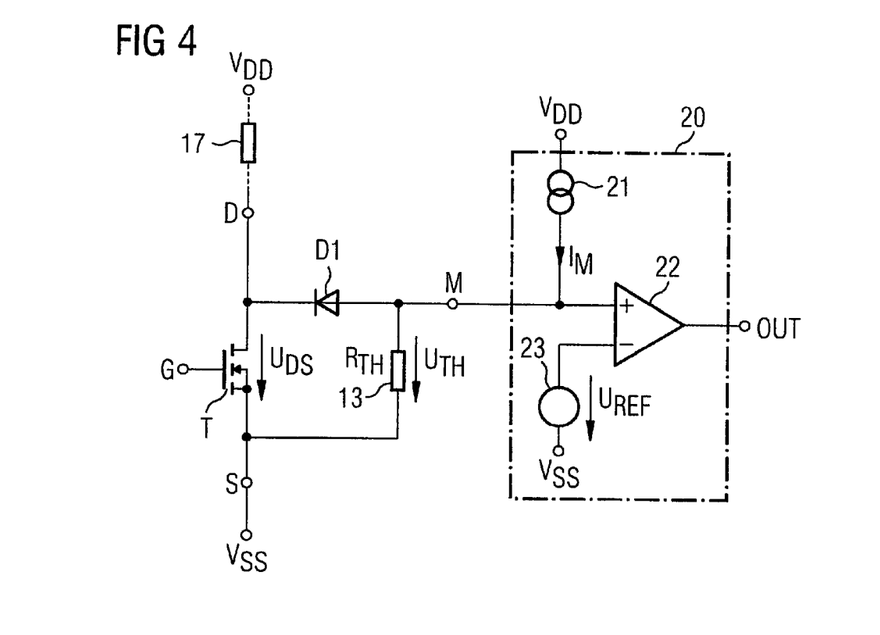
FIG. 4 shows a first exemplary embodiment of an evaluation circuit connected to the temperature measuring resistor.

FIG. 4 shows the electrical equivalent circuit diagram for the semiconductor arrangement explained above and an evaluation circuit which is connected to the measuring resistor 13 for measuring the temperature as a temperature-dependent voltage value and for comparing it with a reference voltage.

The design and operation of this evaluation circuit 20 is explained below for the operating situation in which the power transistor T is used to switch a load 17 which is connected in series with the drain-source path D-S of the transistor T between terminals for a first and a second positive supply potential $V_{DD}$, $V_{SS}$. In the example, the transistor T is connected up as a low-side switch and is in the form of an n-channel MOSFET. In this case, the first supply potential $V_{DD}$ is more positive than the second supply potential $V_{SS}$.

In the example shown, a first terminal of the measuring resistor 13 is connected to the source terminal S of the transistor T. A second terminal of the measuring resistor 13 is connected via the diode $D_1$ to the drain terminal D of the transistor T and directly to the measuring terminal M.

In the example, the evaluation circuit 20 has a current source 21, a comparator 22 and a reference voltage source 23. The current source 21 is connected to the measuring terminal M and is designed to provide a constant measuring current $I_M$ to the measuring resistor 13. This current $I_M$ brings about a temperature-dependent voltage drop $U_{TH}$ across the measuring resistor 13 between the measuring terminal M and the source terminal S.

This temperature-dependent measuring voltage $U_{TH}$ is compared by the comparator 22 with a reference voltage $U_{REF}$ provided by the reference voltage source 23. In this case, a first terminal of the reference voltage source 23 is connected to the inverting input (−) of the comparator $K_1$, and a second terminal is connected to the second supply potential $V_{SS}$. The non-inverting input (+) of the comparator 22 is connected to the measuring terminal M.

The resistance value $R_{TH}$ of the measuring resistor varies for a prescribed temperature range within a range of values which is dependent, inter alia, on the dimensioning of the measuring resistor 13 in the semiconductor body. The measuring resistor formed from a doped semiconductor material has a positive temperature coefficient, which means that the measuring voltage increases as temperature rises. The measuring current $I_M$ is adapted to the range of values of the resistance value $R_{TH}$ such that the voltage drop $U_{TH}$ across the measuring resistor 13 is smaller than the sum of the drain-source voltage $U_{DS}$ of the transistor T and the on-state voltage of the diode $D_1$. This ensures that the diode $D_1$ is always reverse biased, so that the measuring current $I_M$ flows exclusively through the measuring resistor 13. Otherwise, a portion of the constant current $I_M$ would flow via the parasitic diode $D_1$ and would thus corrupt the measurement result such that the temperature-dependent voltage $U_{TH}$ exceeds the limit value defined by the reference voltage $U_{REF}$ only at higher temperatures.

However, for small drain-source voltages $U_{DS}$, the power loss in the transistor T and hence also the generation of heat are low anyway.

If the temperature in the semiconductor body exceeds a critical temperature at which the measuring voltage $U_{TH}$ reaches the value of the reference voltage $U_{REF}$, the arrival at this critical temperature is signalled by means of an appropriate logic level at the output of the comparator 23, in the example by means of a high level.

If there is a need for more complex evaluation of the temperature, i.e. of a temperature profile or of a temperature increase over time, for example, then the analog temperature-dependent signal $U_{TH}$ can be tapped off directly from the measuring terminal M and can be supplied to a suitable, for example digital, processing unit (not shown). In this case, the comparator and the reference voltage source can be dispensed with.

The evaluation circuit 20 may be integrated (not shown in more detail) in the same semiconductor body as the transistor T and the measuring resistor 13. In addition, it is also possible to integrate the evaluation circuit 20 in a separate semiconductor body which, by way of example, may be arranged on the semiconductor body using chip-on-chip technology or next to the semiconductor body with the transistor and the measuring resistor using chip-by-chip technology.

Figure 5:
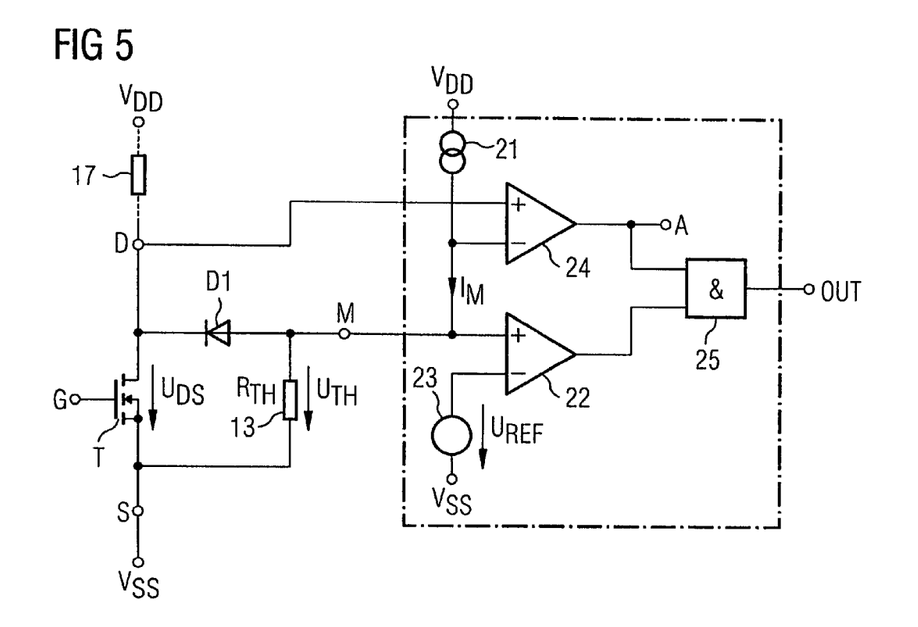
FIG. 5 shows a second exemplary embodiment of the evaluation circuit.

FIG. 5 shows a more sophisticated embodiment of the evaluation circuit explained with reference to FIG. 4. To ensure that no temperature evaluation is carried out when the parasitic diode $D_1$ is on, the evaluation circuit 20 comprises a second comparator 24 which evaluates a voltage-drop across the diode $D_1$ and which, in the example, produces a high level at its output only when the diode is reverse biased, that is to say when the electrical potential at the measuring output M is lower than at the drain terminal D of the transistor T. The inverting input (−) of the second comparator 24 is to this end connected to the measuring terminal M, and its non-inverting input (+) is connected to the drain terminal D of the transistor.

Output signals from the first and second comparators 22, 24 are logically combined by an AND gate 24 which ensures that the result of the comparison at the output of the first comparator 22 is supplied to the output OUT only when the diode $D_1$ is reverse biased.

The facts of the matter have thus far been explained with reference to n-channel MOSFETs, but it is also possible, without further restriction, to reverse the doping types and the polarity of the supply potentials in order to arrive at another embodiment of the invention suitable forming p-channel transistors too.

Figure 6A:
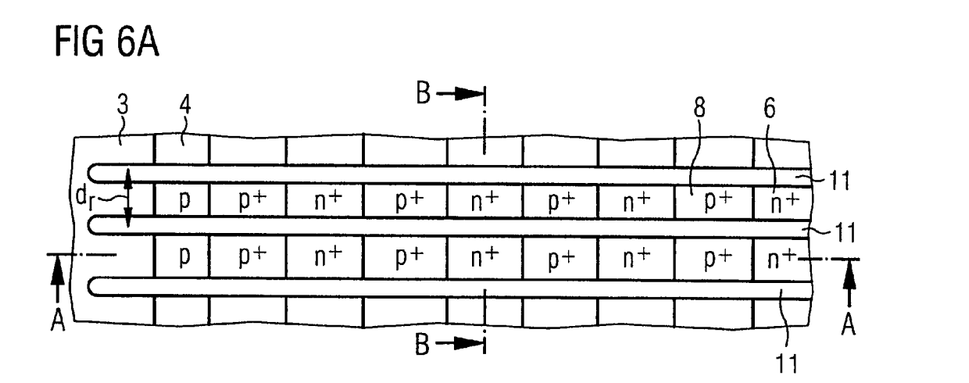
FIG. 6 shows another exemplary embodiment of a semiconductor component arrangement in plan view (FIG. 5A) and in cross section in sectional planes A-A (FIG. 5B) and B-B (FIG. 5C).
Figure 6B:
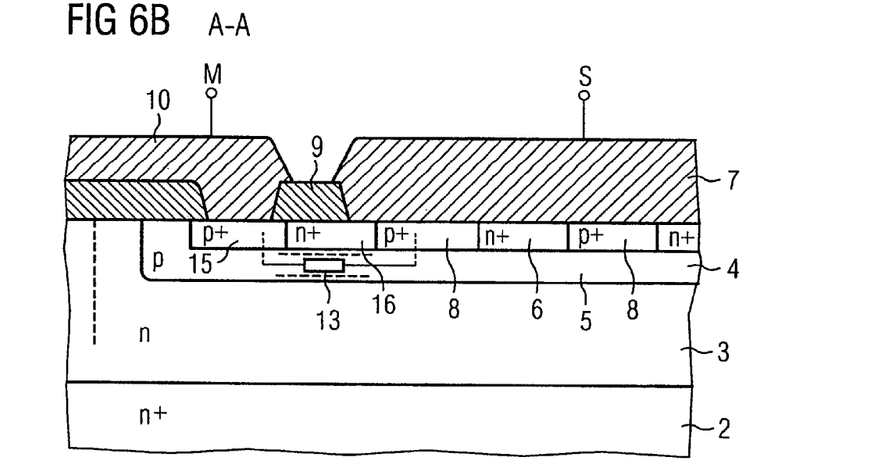
Figure 6C:
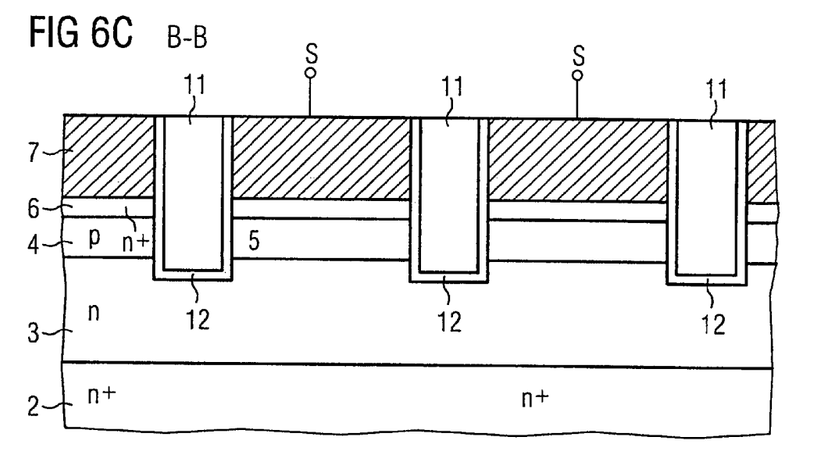

Another exemplary embodiment of a semiconductor component arrangement having a trench transistor and having a measuring resistor 13 integrated in the body zone of the transistor is explained below with reference to FIGS. 6A to 6C. FIG. 6A shows a lateral cross section running in parallel with the front 101. FIG. 6B shows a vertical cross section in a sectional plane A-A shown in FIG. 6A, and FIG. 6C shows a vertical cross section in a sectional plane B-B shown in FIG. 6A.

With reference to FIG. 6A, the trench transistor shown has a number of trenches running in parallel with one another which have gate electrodes 11 arranged in them (for reasons of clarity, the gate dielectric has not been shown). Arranged successively in the longitudinal direction of the trenches, which corresponds to the first lateral direction of the semiconductor body 100, are a number of source zones 6 and body connecting zones 8, which respectively extend from trench to trench in the second lateral direction. With reference to FIG. 6B, these source zones 6 and body connecting zones 8 are connected together by a source electrode 7.

With reference to FIG. 6B, the body zone 5 situated in a vertical direction below the source zones 6 and the body connecting zones 8 is formed by a semiconductor zone 4. This semiconductor zone 4 ends before the trenches with the gate electrodes 11 in the first lateral direction. To improve understanding, FIG. 6B shows the position of such a gate electrode 11 in dashes.

In the example, the temperature measuring resistor 13 is formed by a section of the semiconductor zone 4 which is situated in the region of an end of this semiconductor zone 4. The region of the semiconductor zone 4 which is used as the temperature measuring resistor 13 is in contact with two highly doped connecting zones 8, 15, a first of which is connected to the source electrode 7 and is simultaneously used to connect the source electrode 7 to the body zone 5. A second connecting zone 15 is connected to a separate electrode 10 which forms the measuring terminal. The first and second connecting zones 8, 15 of the temperature measuring resistor are arranged at a distance from one another in the first lateral direction, with an intermediate zone 16 of complementary doping being arranged between these two connecting zones 8, 15 in the first lateral direction.

This intermediate zone 16 is likewise connected to the source electrode and, when there is a flow of current through the resistor region, brings about partial constriction of the channel running in a lateral direction in the semiconductor zones 4. Accordingly, the drift zone 3 arranged below the semiconductor zone 4 in the resistor region ensures that the channel is narrowed in this manner. This narrowing of the channel is also called the body pinch effect and causes the temperature measuring resistor to take on a higher resistance and thereby to have a higher temperature coefficient.

Figure 7:
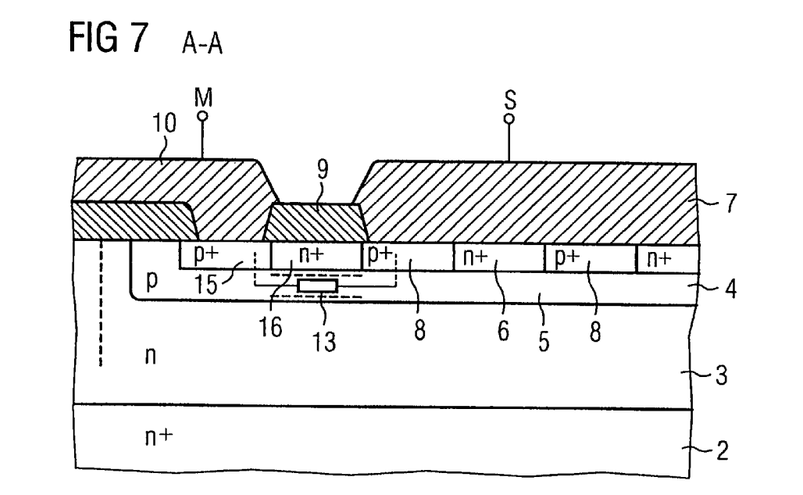
FIG. 7 shows a modification of the arrangement shown in FIG. 6.

In the case of a variant shown in FIG. 7, the intermediate zone is arranged in floating fashion, and hence is not connected to the source electrode 7. In this context, a pinch effect results only from the different dopings of the intermediate zone and the section of the semiconductor zone 4 or body zone 5 which forms the temperature measuring resistor 13.

The resistance value of the measuring resistor 13 formed by the doped semiconductor zone 4 or the body zone 5 is temperature dependent and, furthermore, is also subject to a "bulk control effect", which results in the resistance value increasing as the drain-source voltage $U_{DS}$ increases at constant temperature.

The result of this is that the voltage-drop across the measuring resistor 13 reaches the reference voltage even at lower temperatures. This relationship can be used to lower the over-temperature threshold for large voltages $U_{DS}$ between the drain and source terminals of the transistor and hence for a large power loss. If this is not wanted, this effect can be compensated for by varying the measuring current $I_M$ from the current source on the basis of the drain-source voltage. In this case, the current source explained with reference to FIGS. 4 and 5 needs to be implemented in the form of a voltage-controlled current source which provides a measuring current which is dependent on the drain-source voltage $U_{DS}$ and which decreases at least in sections as the drain-source voltage $U_{DS}$ increases.

The invention claimed is:

1. A semiconductor component arrangement, comprising:
    a power transistor comprising a gate electrode, a source zone, a drain zone and a body zone, said body zone being arranged in a first semiconductor zone of a first conduction type,
    a temperature measuring circuit comprising a temperature-dependent resistor, which is formed by a portion of said first semiconductor zone, and an evaluation circuit coupled to said temperature-dependent resistor;
    wherein said temperature-dependent resistor in said first semiconductor zone is in contact with first and second connecting zones which are of the same conduction type as the first semiconductor zone, but which have a higher level of doping, and which are in contact with first and second connecting electrodes.

2. The semiconductor component arrangement of claim 1, wherein said power transistor further comprises a source electrode and
    wherein one of said first and second connecting zones of said temperature-dependent resistor is connected to the source electrode.

3. The semiconductor component arrangement of claim 1, further comprising an intermediate zone having a doping that is complementary to that of said connecting zones, the intermediate zone disposed between said connecting zones and adjoining said first semiconductor zone.

4. The semiconductor component arrangement of claim 1, wherein said evaluation circuit comprises a constant current source which is connected in series with said temperature-dependent resistor.

5. The semiconductor component arrangement of claim 1, wherein said evaluation circuit configured to compare a voltage-drop across the temperature-dependent resistor with a reference voltage, and to signal the result of the comparison on a signal line.

6. The semiconductor component arrangement of claim 3, wherein said intermediate zone is arranged electrically floating.

7. The semiconductor component arrangement of claim 3, wherein said intermediate zone is connected to one of said first and second connecting electrodes.

8. The semiconductor component arrangement of claim 5, wherein said evaluation circuit comprises a comparator having a first and a second input and an output, said first input operably connected to said temperature-dependent resistor, and said second input operably connected to a reference voltage source, and said output operably connected to said signal line.

9. A semiconductor component arrangement, which has:
    a power transistor comprising a gate electrode, a source zone, a drain zone and a body zone, said body zone being arranged in a first semiconductor zone of a first conduction type;
    a temperature-dependent resistor, which is formed by a portion of said first semiconductor zone, and a constant current source coupled to said temperature-dependent resistor; and
    a node coupled to the resistor providing a voltage level corresponding to the temperature; and
    wherein said temperature-dependent resistor in said first semiconductor zone is in contact with first and second connecting zones which are of the same conduction type as the first semiconductor zone, the connecting zones have a higher level of doping than the temperature dependent resistor.

10. The semiconductor component arrangement of claim 9, wherein said power transistor further comprises a source electrode and wherein one of said first and second connecting zones of said temperature-dependent resistor is connected to the source electrode.

11. The semiconductor component arrangement of claim 9, further comprising an intermediate zone having a doping that is complementary to that of said connecting zones, the intermediate zone disposed between said connecting zones and adjoining said first semiconductor zone.

12. The semiconductor component arrangement of claim 9, further comprising an evaluation circuit configured to compare a voltage at the node with a reference voltage, and to signal the result of the comparison on a signal line.

13. The semiconductor component arrangement of claim 11, wherein said intermediate zone is arranged electrically floating.

14. The semiconductor component arrangement of claim 11, wherein said intermediate zone is connected to a connecting electrode of the arrangement.

15. The semiconductor component arrangement of claim 12, wherein said evaluation circuit comprises a comparator with a first and a second input and an output, said first input connected to said temperature-dependent resistor, and said second input operably connected to a reference voltage source.

* * * * *